(12) United States Patent
Nomura et al.

(10) Patent No.: US 9,490,241 B2
(45) Date of Patent: Nov. 8, 2016

(54) SEMICONDUCTOR DEVICE COMPRISING A FIRST INVERTER AND A SECOND INVERTER

(75) Inventors: Masumi Nomura, Isehara (JP); Tatsuji Nishijima, Hadano (JP); Kosei Noda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 69 days.

(21) Appl. No.: 13/533,113

(22) Filed: Jun. 26, 2012

(65) Prior Publication Data

US 2013/0009146 A1   Jan. 10, 2013

(30) Foreign Application Priority Data

Jul. 8, 2011  (JP) ................................ 2011-151528

(51) Int. Cl.
*H01L 29/10* (2006.01)
*H01L 27/02* (2006.01)
*H01L 27/11* (2006.01)

(52) U.S. Cl.
CPC ....... *H01L 27/0207* (2013.01); *H01L 27/1108* (2013.01)

(58) Field of Classification Search
CPC .................. H01L 27/0207; H01L 27/1108
USPC .............. 257/43, E27.091, E29.2, E29.201, 257/E29.257, E29.26
See application file for complete search history.

(56) References Cited

U.S. PATENT DOCUMENTS

| | | | |
|---|---|---|---|
| 4,132,904 A * | 1/1979 | Harari | G11C 14/00 257/321 |
| 4,805,147 A * | 2/1989 | Yamanaka et al. | 365/154 |
| 4,835,584 A | 5/1989 | Lancaster | |
| 4,853,894 A * | 8/1989 | Yamanaka et al. | 365/154 |
| 4,997,783 A * | 3/1991 | Hsu | 438/209 |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Jay C Kim
(74) *Attorney, Agent, or Firm* — Robinson Intellectual Property Law Office; Eric J. Robinson

(57) ABSTRACT

A semiconductor device which is downsized while a short-channel effect is suppressed and whose power consumption is reduced is provided. A downsized SRAM circuit is formed, which includes a first inverter including a first transistor and a second transistor overlapping with each other; a second inverter including a third transistor and a fourth transistor overlapping with each other; a first selection transistor; and a second selection transistor. An output terminal of the first inverter, an input terminal of the second inverter, and one of a source and a drain of the first selection transistor are connected to one another, and an output terminal of the second inverter, an input terminal of the first inverter, and one of a source and a drain of the second selection transistor are connected to one another.

18 Claims, 9 Drawing Sheets

(56) References Cited

U.S. PATENT DOCUMENTS

| | | | |
|---|---|---|---|
| 5,057,898 A * | 10/1991 | Adan et al. .................. | 257/369 |
| 5,112,765 A * | 5/1992 | Cederbaum et al. ......... | 438/152 |
| 5,157,474 A * | 10/1992 | Ochii .......................... | 257/368 |
| 5,270,257 A * | 12/1993 | Shin ................... | H01L 29/4236 |
| | | | 257/244 |
| 5,349,206 A * | 9/1994 | Kimura ......................... | 257/67 |
| 5,468,979 A | 11/1995 | Tani et al. | |
| 5,528,032 A | 6/1996 | Uchiyama | |
| 5,536,951 A * | 7/1996 | Muragishi ..................... | 257/69 |
| 5,545,584 A * | 8/1996 | Wuu ................. | H01L 21/76877 |
| | | | 257/E21.585 |
| 5,548,153 A * | 8/1996 | Muragishi ..................... | 257/365 |
| 5,583,065 A * | 12/1996 | Miwa .......................... | 438/304 |
| 5,686,334 A * | 11/1997 | Sundaresan .................. | 438/152 |
| 5,687,111 A * | 11/1997 | Wada et al. ................... | 365/154 |
| 5,714,778 A * | 2/1998 | Yamazaki ..................... | 257/298 |
| 5,721,163 A * | 2/1998 | Sundaresan .................. | 438/153 |
| 5,731,856 A | 3/1998 | Kim et al. | |
| 5,744,864 A | 4/1998 | Cillessen et al. | |
| 5,754,467 A * | 5/1998 | Ikeda et al. ................... | 365/154 |
| 5,888,868 A | 3/1999 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,831,852 B2 | 12/2004 | Ishigaki et al. | |
| 6,853,022 B2 | 2/2005 | Koga et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,365,398 B2 * | 4/2008 | Tiwari et al. ................. | 257/368 |
| 7,385,224 B2 | 6/2008 | Ishii et al. | |
| 7,387,919 B2 * | 6/2008 | Kwak et al. .................. | 438/153 |
| 7,402,506 B2 | 7/2008 | Levy et al. | |
| 7,411,209 B2 | 8/2008 | Endo et al. | |
| 7,439,153 B2 | 10/2008 | Tsuboi et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,592,216 B2 | 9/2009 | Lin et al. | |
| 7,592,224 B2 | 9/2009 | Swift et al. | |
| 7,674,650 B2 | 3/2010 | Akimoto et al. | |
| 7,732,819 B2 | 6/2010 | Akimoto et al. | |
| 7,852,655 B2 | 12/2010 | Tanaka | |
| 7,863,611 B2 | 1/2011 | Abe et al. | |
| 7,868,391 B2 * | 1/2011 | Paone et al. .................. | 257/369 |
| 8,203,146 B2 | 6/2012 | Abe et al. | |
| 8,575,697 B2 * | 11/2013 | Mazure et al. ............... | 257/347 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0043550 A1 | 3/2004 | Chakihara et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0183286 A1 | 8/2006 | Lee | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0018240 A1 | 1/2007 | Chindalore et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0170499 A1 | 7/2007 | Araki | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0179676 A1 | 7/2008 | Hirano et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0001436 A1 | 1/2009 | Kondo | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089419 A1 | 4/2011 | Yamazaki et al. | |
| 2011/0260158 A1 * | 10/2011 | Takemura ...................... | 257/43 |
| 2012/0187410 A1 | 7/2012 | Yamazaki et al. | |
| 2012/0187417 A1 | 7/2012 | Yamazaki et al. | |
| 2012/0187475 A1 | 7/2012 | Yamazaki et al. | |
| 2012/0273774 A1 | 11/2012 | Noda | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-014565 A | 1/1990 |
| JP | 05-251705 A | 9/1993 |
| JP | 06-275697 A | 9/1994 |
| JP | 08-264794 A | 10/1996 |
| JP | 11-505377 | 5/1999 |

(56) References Cited

FOREIGN PATENT DOCUMENTS

| | | |
|---|---|---|
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2007-103862 A | 4/2007 |
| JP | 2007-194562 A | 8/2007 |
| JP | 2008-042050 A | 2/2008 |
| JP | 2008-187007 A | 8/2008 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG—Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C. ,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2009, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Kim, "Technology for sub-50nm DRAM and NAND Flash Manufacturing," IEDM 05: Technical Digest of International Electron Devices Meeting, Dec. 5, 2005, pp. 333-336.

Chen et al., "16nm Functional 0.039 μm2 6T-SRAM Cell with Nano Injection Lithography, Nanowire Channel, and Full TiN Gate," IEDM 09: Technical Digest of International Electron Devices Meeting, Dec. 7, 2009, pp. 958-960.

* cited by examiner

● In
☾ Sn
☾ Zn
● O

FIG. 9A
FIG. 9B
FIG. 9C
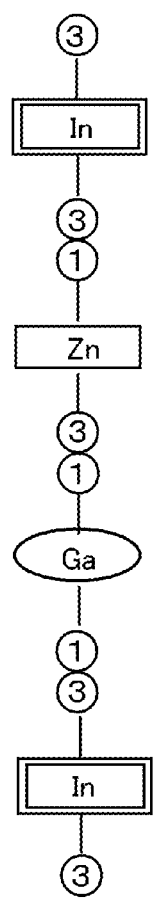
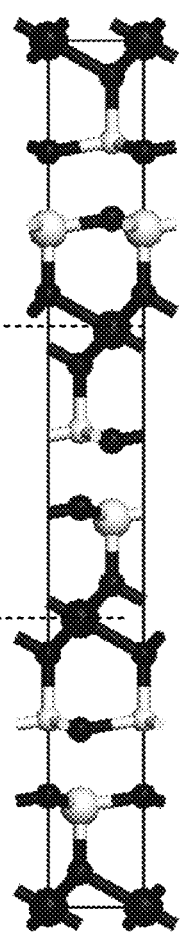
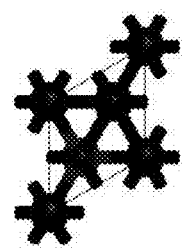
- In
- Ga
- Zn
- O

SEMICONDUCTOR DEVICE COMPRISING A FIRST INVERTER AND A SECOND INVERTER

BACKGROUND OF THE INVENTION

1. Field of the Invention

The present invention relates to a semiconductor device which includes a circuit including a semiconductor element such as a transistor, and a method for manufacturing the semiconductor device. In particular, the present invention relates to a circuit structure and an element structure of a static random access memory (SRAM) and a method for manufacturing the SRAM.

In this specification, a "semiconductor device" generally refers to a device which can function by utilizing semiconductor characteristics; a memory device, an electro-optical device, a light-emitting display device, a semiconductor circuit, and an electronic device are all included in the category of the semiconductor device.

2. Description of the Related Art

A signal processing circuit such as a central processing unit (CPU) has a variety of configurations depending on its application and is generally provided with some kinds of memory devices such as a register and a cache memory as well as a main memory for storing data or a program. A register has a function of temporarily holding data for carrying out arithmetic processing, holding a program execution state, or the like. In addition, a cache memory is located between an arithmetic circuit and a main memory in order to reduce access to the main memory and speed up the arithmetic processing.

In a memory device such as a register or a cache memory, writing of data needs to be performed at higher speed than in a main memory. Thus, a flip-flop or the like is used as a register, and a static random access memory (SRAM) or the like is used as a cache memory, for example. That is, a volatile memory device in which data is erased when supply of power supply potential is stopped is used for such a register, a cache memory, or the like.

A typical example of a volatile memory device is a dynamic random access memory (DRAM). A DRAM stores data in such a manner that a transistor included in a storage element is selected and charge is stored in a capacitor. Thus, when data is read from a DRAM, charge in a capacitor is lost, so that another writing operation is necessary whenever data is read. Moreover, since leakage current (off-state current) flows between a source and a drain of a transistor included in a memory element when the transistor is in an off state, charge flows out of the transistor even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional memory device using a magnetic material or an optical material is needed in order to hold the data for a long time.

Another example of a volatile memory device is an SRAM. An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

An SRAM circuit includes an inverter such as an NMOS inverter or a CMOS inverter.

An SRAM circuit including an NMOS inverter includes four transistors and two resistors. In this case, the SRAM circuit can be formed using n-channel transistors and resistors. Since a p-channel transistor is not needed, the area of a memory cell can be reduced. However, current flows through the resistor when the inverter is turned on; therefore, power consumption is increased.

In contrast, an SRAM circuit including a CMOS inverter includes six transistors; therefore, the area of a memory cell is large. However, only off-state current of a transistor flows when the inverter is turned on, so that power consumption is very low.

Power consumption of a semiconductor device is substantially equal to the sum of power consumed in an operation state and power consumed in a stop state (hereinafter referred to as standby power) of the semiconductor device.

The standby power can be classified into static standby power and dynamic standby power. The static standby power is power consumed by generation of leakage current between a source and a drain, between a gate and the source, and between the gate and the drain in a state where voltage is not applied between the electrodes of a transistor in the semiconductor device, that is, in a state where voltage between the gate and the source is approximately 0 V. On the other hand, the dynamic standby power is power which is consumed when voltages of various signals such as a clock signal or a power supply voltage continues to be supplied to a circuit in a standby state.

Further, in order to increase the operation speed of a semiconductor device, a microfabrication technique has been developed. As microfabrication of a semiconductor device such as a transistor advances, the channel length of the transistor is shortened and the thicknesses of various insulating layers typified by a gate insulating layer are decreased. Therefore, leakage current of the transistor tends to be increased and accordingly the static standby power is increased.

As described above, a memory device including an SRAM can operate at high speed and, like a DRAM, does not require data refresh operation. Further, an SRAM including a CMOS inverter consumes very low power. However, the area occupied by a memory cell is large because the SRAM including a CMOS inverter includes many transistors.

The area of a memory cell can be reduced by devising a circuit layout (see Patent Document 1, for example).

Further, circuit patterns have been miniaturized in accordance with the scaling law, but it seems that a design rule of 100 nm or less is difficult to achieve. One of the reasons is that in a transistor having a channel length of 100 nm or less, leakage current caused by a punch-through phenomenon is likely to flow due to a short-channel effect and the transistor becomes incapable of functioning as a switching element. In order to prevent the punch-through current, a silicon wafer may be doped with an impurity with a high concentration; however, the doping causes a problem in that the junction leakage current easily flows between a source and the substrate or between a drain and the substrate.

Against such a problem, a method is suggested for reducing an area occupied by a memory cell and also maintaining the effective channel length of a transistor by forming a three-dimensional transistor in a semiconductor device so as not to cause a short-channel effect. One example is a structure in which a U-shaped vertically long groove portion is formed in a region where a channel portion of a transistor is formed, a gate insulating film is formed on a wall surface of the groove portion, and a gate electrode is formed so as to fill the groove portion (see Non-Patent Document 1).

A transistor having a channel portion of such a structure has a long effective channel length because current flows between a source region and a drain region via an indirect route across the groove portion. Thus, an effect of reducing the area occupied by a transistor and suppressing a short-channel effect can be obtained.

REFERENCE

Patent Document

[Patent Document 1] Japanese Published Patent Application No. 2008-42050

Non-Patent Document

[Non-Patent Document 1] Kinam Kim, "Technology for sub-50 nm DRAM and NAND Flash Manufacturing", International Electron Devices Meeting 2005, IEDM Technical Digest, December 2005, pp. 333-336.

SUMMARY OF THE INVENTION

As described above, an SRAM is used as a cache memory in a CPU or the like, and power consumption can be particularly reduced when the SRAM includes a CMOS inverter. However, the SRAM including a CMOS inverter requires six transistors, and the inverter circuit includes both p-channel transistors and n-channel transistors. Therefore, an area occupied by a circuit including a CMOS inverter circuit becomes large.

It is an object of an embodiment of the present invention to provide a semiconductor device which achieves miniaturization and suppression of a short-channel effect and consumes less power.

In the present invention, transistors including a three-dimensional channel region are formed, whereby an effective channel length can be longer than an apparent channel length which corresponds to a distance between a pair of low-resistance regions or a distance between a pair of electrodes viewed from the above. Further, the transistors are stacked to overlap with each other; thus, in a region where one transistor is formed when viewed from the above, two transistors are provided.

A technical idea of the present invention is to form an inverter circuit by stacking a transistor which includes an n-type semiconductor and a transistor which includes a p-type semiconductor.

An embodiment of the present invention is a semiconductor device including a first inverter, a second inverter, a first selection transistor, and a second selection transistor. The first inverter includes a first transistor and a second transistor overlapping with each other. The second inverter includes a third transistor and a fourth transistor overlapping with each other. An output terminal of the first inverter, an input terminal of the second inverter, and one of a source and a drain of the first selection transistor are connected to one another. An output terminal of the second inverter, an input terminal of the first inverter, and one of a source and a drain of the second selection transistor are connected to one another. Gates of the first selection transistor and the second selection transistor are connected to a word line. The other of the source and the drain of the first selection transistor is connected to a first signal line. The other of the source and the drain of the second selection transistor is connected to a second signal line. The first transistor includes a semiconductor substrate having a first groove portion between a pair of first low-resistance regions, a first gate insulating film formed on a side surface and a bottom surface of the first groove portion, and a first gate electrode formed in the first groove portion with the first gate insulating film provided between the semiconductor substrate and the first gate electrode. The second transistor includes a second gate insulating film covering the first gate electrode formed in the first groove portion, a first semiconductor film overlapping with the first gate electrode with the second gate insulating film provided therebetween, and a pair of first electrodes in contact with the first semiconductor film. The third transistor includes the semiconductor substrate having a second groove portion between a pair of second low-resistance regions, a third gate insulating film formed on a side surface and a bottom surface of the second groove portion, and a second gate electrode formed in the second groove portion with the second gate insulating film provided between the semiconductor substrate and the second gate electrode. The fourth transistor includes a fourth gate insulating film covering the second gate electrode formed in the second groove portion, a second semiconductor film overlapping with the second gate electrode with the fourth gate insulating film provided therebetween, and a pair of second electrodes in contact with the second semiconductor film. The first gate electrode, one of the pair of second low-resistance regions, and one of the pair of second electrodes are connected to one another. The second gate electrode, one of the pair of first low-resistance regions, and one of the pair of first electrodes are connected to one another.

In an embodiment of the present invention, the pair of first electrodes may be formed between the second gate insulating film and the first semiconductor film, and the pair of second electrodes may be formed between the fourth gate insulating film and the second semiconductor film.

Further, in an embodiment of the present invention, the first semiconductor film may be formed between the second gate insulating film and the pair of first electrodes, and the second semiconductor film may be formed between the fourth gate insulating film and the pair of second electrodes.

In an embodiment of the present invention, the semiconductor substrate may be an n-type semiconductor, and the pair of first low-resistance regions and the pair of second low-resistance regions may each be a p-type semiconductor.

In an embodiment of the present invention, the first gate insulating film and the third gate insulating film may be formed from the same film, and the second gate insulating film and the fourth gate insulating film may be formed from the same film.

In an embodiment of the present invention, the first semiconductor film and the second semiconductor film may each include an oxide semiconductor including one or more of elements selected from In, Ga, Sn, and Zn. With the use of the oxide semiconductor for a channel region of a transistor, the amount of off-state current of the transistor can be small. Thus, when the transistor including the oxide semiconductor is applied to a memory device or the like, power consumption can be reduced.

According to an embodiment of the present invention, a semiconductor device which achieves miniaturization and suppression of a short-channel effect and consumes less power can be provided.

BRIEF DESCRIPTION OF THE DRAWINGS

In the accompanying drawings:

FIGS. 9A to 9C illustrate a structure of an oxide material according to an embodiment of the present invention.

DETAILED DESCRIPTION OF THE INVENTION

Figure 1A:
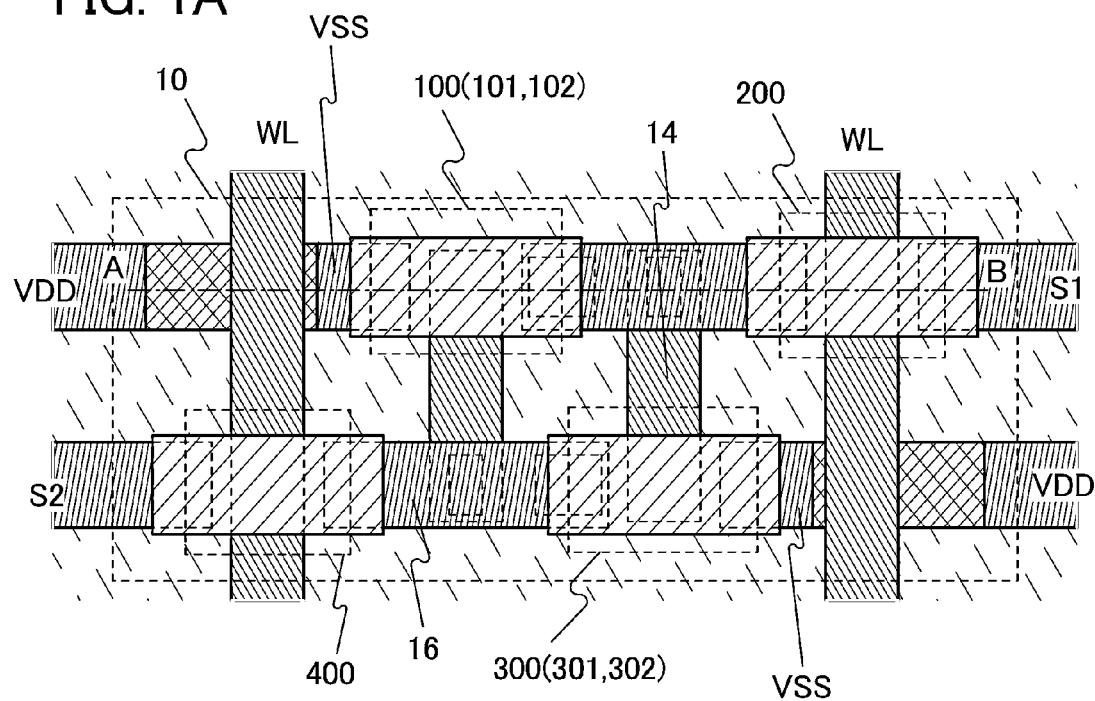
FIGS. 1A and 1B are a top view and a circuit diagram illustrating an example of a semiconductor device according to an embodiment of the present invention.

Embodiments of the present invention will be described with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the present invention described below, the same portions or portions having similar functions are denoted by the same reference numerals in different drawings, and description of such portions is not repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

In addition, in this specification, when one of a source and a drain of a transistor is called a drain, the other is called a source. That is, they are not distinguished depending on the potential level. Therefore, a portion called a source in this specification can be alternatively referred to as a drain.

Embodiment 1

In this embodiment, an example of a semiconductor device according to an embodiment of the present invention will be described with reference to FIGS. 1A and 1B and FIG. 2.

FIG. 1A is a top view of a memory cell in the semiconductor device. FIG. 2 is a cross-sectional view taken along dashed-dotted line A-B in FIG. 1A. FIG. 1B is a circuit diagram of a memory cell 10 in FIG. 1A. In FIG. 1A, some of components of transistors are omitted to avoid complexity.

In FIG. 1A, the memory cell 10, which is an SRAM circuit, includes a first inverter 100, a second inverter 300, a first selection transistor 200, and a second selection transistor 400. The first inverter 100 and the second inverter 300 each include two transistors overlapping with each other. The two transistors are a p-channel transistor and an n-channel transistor. In other words, the SRAM circuit is formed using CMOS inverters. The first inverter 100 includes a first transistor 101 and a second transistor 102, and the second inverter 300 includes a third transistor 301 and a fourth transistor 302.

Figure 1B:
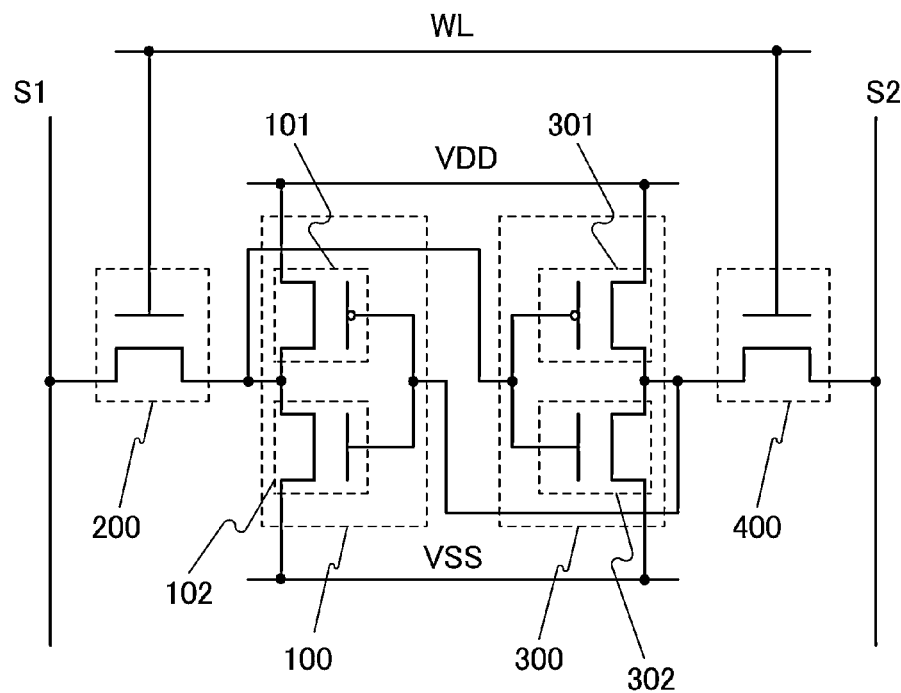

In FIG. 1B, the SRAM circuit, which is the memory cell of this embodiment, includes the first inverter 100 including the first transistor 101 and the second transistor 102, the second inverter 300 including the third transistor 301 and the fourth transistor 302, the first selection transistor 200, and the second selection transistor 400. An output terminal of the first inverter 100, an input terminal of the second inverter 300, and one of a source and a drain of the first selection transistor 200 are connected to one another. An output terminal of the second inverter 300, an input terminal of the first inverter 100, and one of a source and a drain of the second selection transistor 400 are connected to one another. Gates of the first selection transistor 200 and the second selection transistor 400 are connected to a word line (WL). The other of the source and the drain of the first selection transistor 200 is connected to a first signal line (S1). The other of the source and the drain of the second selection transistor 400 is connected to a second signal line (S2). The first inverter 100 and the second inverter 300 are connected to VDD which is a high potential power supply line and to VSS which is a low potential power supply line.

The transistors included in the memory cell 10 are described in detail with reference to FIG. 2.

Figure 2:
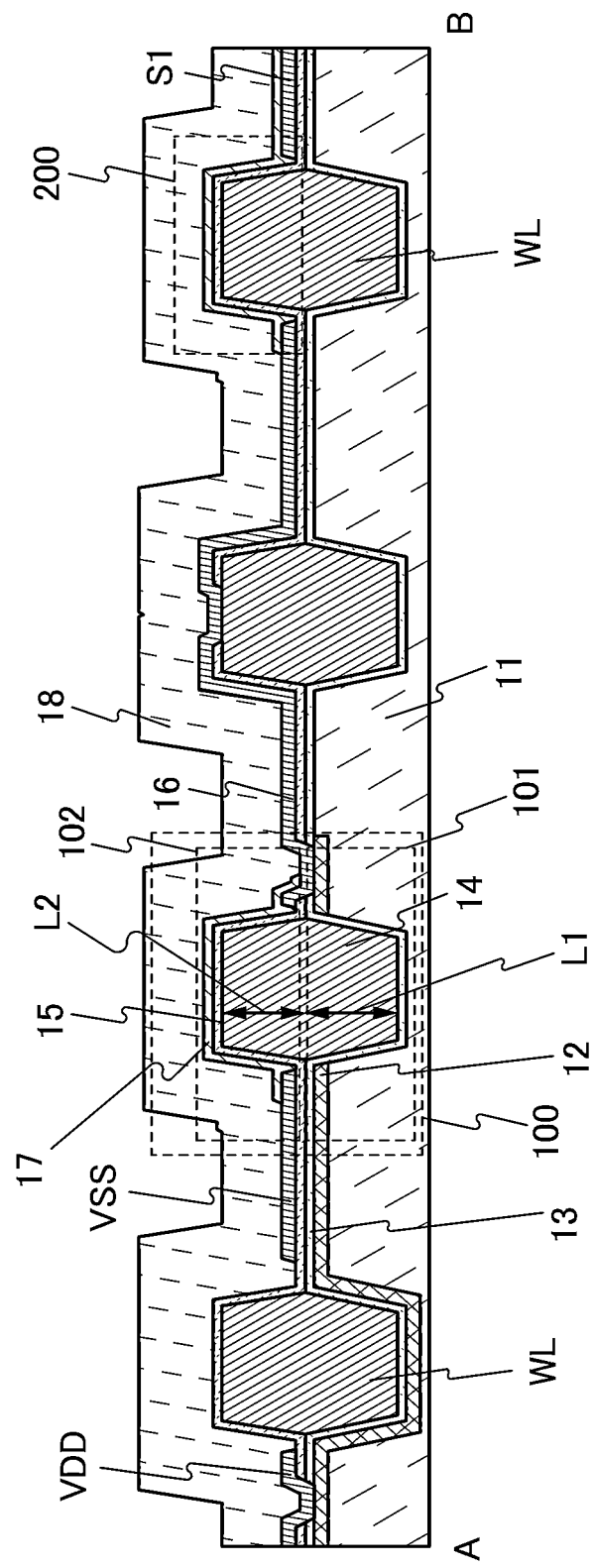
FIG. 2 is a cross-sectional view illustrating an example of a semiconductor device according to an embodiment of the present invention.

The first inverter 100 in FIG. 2 includes the first transistor 101 and the second transistor 102 overlapping with each other. The first selection transistor 200 is formed in a manner similar to that of the second transistor 102.

The first inverter 100 illustrated in FIG. 2 includes a semiconductor substrate 11 having a groove portion, a pair of low-resistance regions 12 provided in the semiconductor substrate 11, a first gate insulating film 13 over the semiconductor substrate 11 and the pair of low-resistance regions 12, a gate electrode 14 over the first gate insulating film 13 and between the pair of low-resistance regions 12, a second gate insulating film 15 over the first gate insulating film 13 and the gate electrode 14, a pair of electrodes 16 one of which is connected to one of the pair of low-resistance regions 12 through a contact hole provided in the first gate insulating film 13 and the second gate insulating film 15, a semiconductor film 17 provided in contact with the pair of electrodes 16 and overlapping with the gate electrode 14 with the second gate insulating film 15 provided therebetween, and an interlayer insulating film 18 over the semiconductor film 17, the pair of electrodes 16, and the second gate insulating film 15. The first inverter 100 is formed using the transistors in which one of the pair of low-resistance regions 12 is electrically connected to one of the pair of electrodes 16. Further, a contact hole may be formed in the interlayer insulating film 18, and a wiring which is connected to the pair of electrodes 16 through the contact hole may be provided.

In the structure, the first transistor 101 is formed with the semiconductor substrate 11, the pair of low-resistance regions 12, the first gate insulating film 13, and the gate electrode 14, and the second transistor 102 is formed with the gate electrode 14, the second gate insulating film 15, the pair of electrodes 16, and the semiconductor film 17.

A single crystal semiconductor substrate or a polycrystalline semiconductor substrate of silicon, silicon carbide, or the like; a compound semiconductor substrate of GaAs or the like; an SOI (silicon on insulator) substrate; or the like can be used as the semiconductor substrate 11. Further, the semiconductor substrate 11 is not limited to the above substrate, and a substrate provided with a layer having semiconductor characteristics may be used.

The pair of low-resistance regions 12 functions as a source region and a drain region of the first transistor 101, which can also be used as a wiring by reducing resistance sufficiently. The pair of low-resistance regions 12 includes an impurity element which makes the semiconductor substrate 11 have n-type or p-type conductivity. As the impurity element imparting n-type or p-type conductivity, for example, phosphorus, boron, or the like can be used.

The first gate insulating film 13 can be formed by a deposition method such as a CVD method or a sputtering method. For example, the first gate insulating film 13 may be a single layer or a stacked layer formed using one or more of a silicon oxide film, a silicon oxynitride film, a silicon nitride oxide film, a silicon nitride film, a gallium oxide film, an aluminum oxide film, and an aluminum oxynitride film. Further, the first gate insulating film 13 may be formed by thermal oxidation or thermal nitridation of the semiconductor substrate 11. Moreover, plasma treatment may be performed in an atmosphere containing oxygen with a high-density plasma apparatus to improve the withstand voltage of the gate insulating film.

When the first gate insulating film 13 is formed using a high-k material such as hafnium silicate (HfSi$O_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, gate leakage current can be decreased. Further, a structure in which the above high-k material and one or more of silicon oxide, silicon oxynitride, silicon nitride, silicon nitride oxide, aluminum oxide, aluminum oxynitride, and gallium oxide are stacked can be used.

Note that here, silicon oxynitride contains more oxygen than nitrogen and contains, for example, oxygen, nitrogen, silicon, and hydrogen at concentrations higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. Further, silicon nitride oxide contains more nitrogen than oxygen and contains, for example, oxygen, nitrogen, silicon, and hydrogen at concentrations higher than or equal to 5 at. % and lower than or equal to 30 at. %, higher than or equal to 20 at. % and lower than or equal to 55 at. %, higher than or equal to 25 at. % and lower than or equal to 35 at. %, and higher than or equal to 10 at. % and lower than or equal to 25 at. %, respectively. Note that rates of oxygen, nitrogen, silicon, and hydrogen fall within the aforementioned ranges in the cases where measurement is performed using Rutherford backscattering spectrometry (RBS) or hydrogen forward scattering (HFS). Moreover, the total percentage of the constituent elements does not exceed 100 at. %.

The gate electrode 14 can be formed using polycrystalline silicon including an impurity imparting n-type or p-type conductivity. Further, the gate electrode 14 can be formed using a metal element selected from aluminum, chromium, copper, tantalum, titanium, molybdenum, and tungsten; an alloy containing any of these metal elements as a component; an alloy containing these metal elements in combination; and the like. Further, one of or both manganese and zirconium may be used. Further, the gate electrode 14 may have a single-layer structure or a stacked-layer structure of two or more layers.

The gate electrode 14 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

The second gate insulating film 15 can be formed by a deposition method such as a CVD method or a sputtering method. For example, the second gate insulating film 15 may be a single layer or a stacked layer formed using one or more of a silicon oxide film, a silicon oxynitride film, a silicon nitride oxide film, a silicon nitride film, a gallium oxide film, an aluminum oxide film, and an aluminum oxynitride film. Furthermore, a high-k material may be used, which is similar to the first gate insulating film 13.

In the case where an oxide semiconductor is used for the semiconductor film 17 of the second transistor 102, a film from which oxygen is released by heating is preferably used for the second gate insulating film 15.

"Oxygen is released by heating" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

Here, a method in which the amount of released oxygen is measured by being converted into oxygen atoms using TDS analysis will be described.

The amount of released gas in TDS analysis is proportional to the integral value of a spectrum. Therefore, the amount of released gas can be calculated from the ratio of the integral value of a spectrum of a measurement sample to the reference value of a standard sample. The reference value of a standard sample refers to the ratio of the density of a predetermined atom contained in a sample to the integral value of a spectrum of the predetermined atom contained in the sample.

For example, the number of oxygen molecules (N$_{O2}$) released from a measurement sample can be found according to Numerical Expression 1 with the TDS analysis results of a silicon wafer containing hydrogen at a predetermined density which is the standard sample and the TDS analysis results of the measurement sample. Here, all spectra at a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2}=N_{H2}/S_{H2} \times S_{O2} \times \alpha \quad \text{(Numerical Expression 1)}$$

$N_{H2}$ is the value obtained by conversion of the number of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the measurement sample is subjected to TDS analysis. $\alpha$ is a coefficient affecting the intensity of the spectrum in the TDS analysis. Refer to Japanese Published Patent Application No. H6-275697 for details of Numerical Expression 1. Note that the amount of released oxygen from the above measurement sample is measured with a thermal desorption spectroscopy apparatus produced by ESCO Ltd., EMD-WA1000S/W using a silicon wafer containing a hydrogen atom at $1 \times 10^{16}$ atoms/cm$^3$ as the standard sample.

Further, in the TDS analysis, part of released oxygen is detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heating may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

As described above, by using a film from which oxygen is released by heating as the second gate insulating film 15, oxygen is supplied from the second gate insulating film 15 to an oxide semiconductor used for the semiconductor film 17, and thus the interface states of an interface between the second gate insulating film 15 and the semiconductor film 17 can be reduced. As a result, charge or the like, which is generated due to the operation of the second transistor 102 or the like, can be prevented from being trapped at the interface between the second gate insulating film 15 and the semiconductor film 17, so that the second transistor 102 with little degradation of electric characteristics can be obtained.

Further, electric charge is generated because of oxygen vacancies in the oxide semiconductor in some cases. In general, when oxygen vacancies are caused in an oxide semiconductor, part of the oxygen vacancies becomes a donor and causes generation of an electron serving as a carrier. As a result, the threshold voltage of a transistor shifts in the negative direction. However, as described above, oxygen is sufficiently released from the second gate insulating film 15 to the semiconductor film 17, so that oxygen vacancies in the oxide semiconductor used for the semiconductor film 17 in the transistor, which cause the negative shift of the threshold voltage, can be reduced.

The pair of electrodes 16 is electrodes functioning as a source electrode and a drain electrode of the second transistor 102. The pair of electrodes 16 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used. Note that the pair of electrodes 16 also serves as wirings.

The semiconductor film 17 may be formed by a sputtering method, a plasma CVD method, a pulsed laser deposition (PLD) method, a molecular beam epitaxy (MBE) method, a coating method, a printing method, an evaporation method, or the like.

For the semiconductor film 17, amorphous silicon, microcrystalline silicon, polycrystalline silicon, silicon germanium, amorphous germanium, polycrystalline germanium, an oxide semiconductor, or the like can be used. With the use of an oxide semiconductor, a transistor with a small amount of off-state current can be formed. Thus, the transistor including an oxide semiconductor is applied to a logic circuit or the like, and power consumption can be reduced. Therefore, an oxide semiconductor is preferably used for the semiconductor film 17.

A sputtering apparatus used for forming an oxide semiconductor film as the semiconductor film 17 by a sputtering method will be described in detail below.

The leakage rate of a treatment chamber in which the oxide semiconductor film is formed is preferably lower than or equal to $1 \times 10^{-10}$ Pa·m$^3$/sec., whereby entry of an impurity into the film to be formed by a sputtering method can be decreased.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m$^3$/sec.

In order to reduce external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and thus the external leakage can be reduced. Further, by use of a metal material covered with iron fluoride, aluminum oxide, chromium oxide, or the like which is in the passive state, a released gas containing hydrogen generated from the metal gasket is suppressed, so that the internal leakage can also be reduced.

As a member for forming an inner wall of the treatment chamber, aluminum, chromium, titanium, zirconium, nickel, or vanadium, from which the amount of a released gas containing hydrogen is small, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the film formation apparatus may be covered with iron fluoride, aluminum oxide, chromium oxide, or the like which is in the passive state.

Furthermore, it is preferable to provide a refiner for a sputtering gas just in front of the treatment chamber. At this time, the length of a pipe between the gas refiner and the treatment chamber is less than or equal to 5 m, preferably less than or equal to 1 m. When the length of the pipe is less than or equal to 5 m or less than or equal to 1 m, the effect of the released gas from the pipe can be reduced accordingly.

Evacuation of the treatment chamber is preferably performed with a rough vacuum pump such as a dry pump, and a high vacuum pump such as a sputter ion pump, a turbo molecular pump, or a cryopump, in appropriate combination. As for the high vacuum pump, the turbo molecular pump has an outstanding capability in evacuating a large-sized molecule whereas it has a low capability in evacuating hydrogen or water; therefore, combination of a cryopump having a high capability in evacuating water and a turbo molecular pump having an outstanding capability in evacuating a large-sized molecule is effective.

An adsorbate present at the inner wall of the treatment chamber does not affect the pressure in the treatment chamber because it is adsorbed on the inner wall, but the adsorbate leads to release of a gas at the time of the evacuation of the treatment chamber. Therefore, although the leakage rate and the evacuation rate do not have a correlation, it is preferable that the adsorbate present in the treatment chamber be removed as much as possible and evacuation be performed in advance with use of a pump having high evacuation capability. Note that the treatment chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

In a sputtering method, an RF power supply device, an AC power supply device, a DC power supply device, or the like can be used as a power supply device for generating plasma as appropriate.

The oxide semiconductor film preferably contains one or more elements selected from In, Ga, Sn, and Zn. Such an oxide semiconductor can be formed using, for example, a target of a four-component metal oxide such as an In—Sn—Ga—Zn-based metal oxide; a three-component metal oxide such as an In—Ga—Zn-based metal oxide, an In—Sn—Zn-based metal oxide, or an In—Al—Zn-based metal oxide; a two-component metal oxide such as an In—Zn-based metal oxide; or the like. In addition, any of the above oxide semiconductors may contain an element other than In, Ga, Sn, and Zn, e.g., Gd, Zr, or $SiO_2$ which is an oxide of Si.

For example, an In—Ga—Zn—O-based oxide semiconductor means an oxide semiconductor containing indium (In), gallium (Ga), and zinc (Zn).

As a target used for an In—Sn—Zn—O-based metal oxide, an oxide target with an atomic ratio of In:Sn:Zn=1:2:2, 2:1:3, 1:1:1, 20:45:35, or the like is used.

As the oxide semiconductor, a thin film represented by the chemical formula, $InMO_3(ZnO)_m$ (m>0) can be used. Here, M represents one or more metal elements selected from Sn, Zn, Ga, Al, Mn, and Co. For example, M can be Ga, Ga and Al, Ga and Mn, Ga and Co, or the like.

In the case where an In—Ga—Zn—O-based material is used as the oxide semiconductor, an example of the target is a metal oxide target containing In, Ga, and Zn at a composition ratio where $In_2O_3$:$Ga_2O_3$:ZnO=1:1:1 [molar ratio]. Alternatively, a target having a composition ratio where $In_2O_3$:$Ga_2O_3$:ZnO=1:1:2 [molar ratio], a target having a composition ratio where $In_2O_3$:$Ga_2O_3$:ZnO=1:1:4 [molar ratio], or a target having a composition ratio where $In_2O_3$:$Ga_2O_3$:ZnO=2:1:8 [molar ratio] can be used. Alternatively, a target having a composition ratio where $In_2O_3$:ZnO=25:1 to 1:4 [molar ratio] can be used.

In the case where an In—Zn—O-based material is used as an oxide semiconductor, a target used has an atomic ratio of In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, in a target used for formation of an In—Zn—O-based oxide semiconductor with an atomic ratio where In:Zn:O=X:Y:Z, the relation of Z>1.5X+Y is satisfied.

As a sputtering gas, a rare gas (typically argon) atmosphere, an oxygen atmosphere, or a mixed gas of a rare gas and oxygen is used as appropriate. It is preferable that a high-purity gas from which impurities such as hydrogen, water, a hydroxyl group, and hydride are removed be used as a sputtering gas.

As for the oxide semiconductor, a material which has a band gap of 2.5 eV or more, preferably has a band gap of 3.0 eV or more, is selected in order to reduce the off-state current of the transistor.

The concentration of hydrogen contained in the oxide semiconductor is lower than $5\times10^{18}$ $cm^{-3}$, preferably lower than or equal to $1\times10^{18}$ $cm^{-3}$, further preferably lower than or equal to $5\times10^{17}$ $cm^3$, still further preferably lower than or equal to $1\times10^{16}$ $cm^{-3}$.

An alkali metal is not an element included in the oxide semiconductor, and therefore, is an impurity. An alkaline earth metal is also an impurity in the case where an alkaline earth metal is not a constituent for forming the oxide semiconductor. In particular, when an insulating film in contact with the oxide semiconductor film is an oxide, sodium (Na) among the alkali metals diffuses into the insulating film and becomes a sodium ion ($Na^+$). Further, in the oxide semiconductor film, $Na^+$ cuts or enters a bond between a metal and oxygen which are included in the oxide semiconductor. As a result, for example, deterioration in characteristics of the transistor such as a normally-on state of the transistor due to a shift of the threshold voltage in the negative direction or a decrease in field-effect mobility occurs; in addition, variation in characteristics is also caused. Therefore, the concentration of an alkali metal which is an impurity in the oxide semiconductor is preferably decreased. Specifically, the measurement value of the Na concentration is preferably lower than or equal to $5\times10^{16}$ $cm^{-3}$, further preferably lower than or equal to $1\times10^{16}$ $cm^{-3}$, still further preferably lower than or equal to $1\times10^{15}$ $cm^{-3}$. In addition, the measurement value of lithium (Li) concentration is preferably lower than or equal to $5\times10^{15}$ $cm^{-3}$, further preferably lower than or equal to $1\times10^{15}$ $cm^{-3}$. In addition, the measurement value of potassium (K) concentration is preferably lower than or equal to $5\times10^{15}$ $cm^{-3}$, further preferably lower than or equal to $1\times10^{15}$ $cm^{-3}$.

By using the oxide semiconductor described above, the off-state current of the transistor can be made small. Specifically, the off-state current of the transistor can be smaller than or equal to $1\times10^{-18}$ A, smaller than or equal to $1\times10^{-21}$ A, or smaller than or equal to $1\times10^{-24}$ A.

The substrate temperature in forming the oxide semiconductor is higher than or equal to 150° C. and lower than or equal to 450° C., preferably higher than or equal to 200° C. and lower than or equal to 350° C. The film formation is performed while the substrate is heated to higher than or equal to 150° C. and lower than or equal to 450° C., preferably higher than or equal to 200° C. and lower than or equal to 350° C., whereby moisture (including hydrogen) or the like is prevented from entering a film.

The oxide semiconductor is in a single crystal state, a polycrystalline (also referred to as polycrystal) state, an amorphous state, or the like.

The oxide semiconductor is preferably a c-axis aligned crystalline oxide semiconductor (CAAC-OS).

The CAAC-OS is not completely single crystal nor completely amorphous. The CAAC-OS is an oxide semiconductor with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS is not clear. Further, with the TEM, a grain boundary in the CAAC-OS is not found. Thus, in the CAAC-OS, a reduction in electron mobility, due to the grain boundary, is suppressed.

In each of the crystal parts included in the CAAC-OS, a c-axis is aligned in a direction parallel to a normal vector of a surface where the CAAC-OS is formed or a normal vector of a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS, distribution of crystal parts is not necessarily uniform. For example, in the formation process of the CAAC-OS, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS, the crystal part in a region to which the impurity is added becomes amorphous in some cases.

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that when the CAAC-OS is formed, the direction of c-axis of the crystal part is the direction parallel to a normal vector of the surface where the CAAC-OS is formed or a normal vector of the surface of the CAAC-OS. The crystal part is formed by film formation or by performing treatment for crystallization such as heat treatment after film formation.

With use of the CAAC-OS in a transistor, change in electric characteristics of the transistor due to irradiation with visible light or ultraviolet light can be reduced. Thus, the transistor has high reliability.

The CAAC-OS is a conductor, a semiconductor, or an insulator, which depends on its composition or the like. The CAAC-OS transmits or does not transmit visible light depending on its composition or the like.

An example of such CAAC-OS is an oxide which is formed into a film shape and has a triangular or hexagonal atomic arrangement when observed from the direction perpendicular to a surface of the film or a surface of a substrate, and in which metal atoms are arranged in a layered manner or metal atoms and oxygen atoms (or nitrogen atoms) are arranged in a layered manner when a cross section of the film is observed.

The CAAC-OS will be described in detail with reference to FIGS. 7A to 7E, FIGS. 8A to 8C, and FIGS. 9A to 9C. In FIGS. 7A to 7E, FIGS. 8A to 8C, and FIGS. 9A to 9C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 7A to 7E, O surrounded by a circle represents tetracoordinate O and O surrounded by a double circle represents tricoordinate O.

Figure 7A:
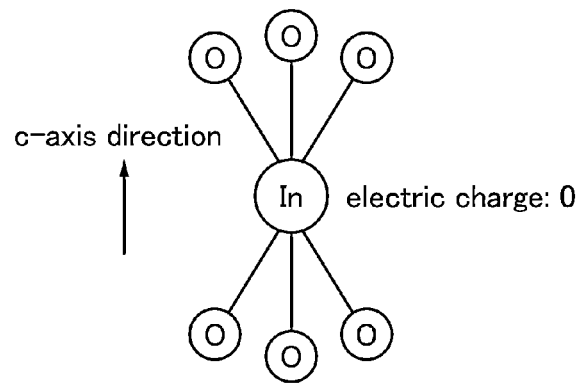
FIGS. 7A to 7E each illustrate a structure of an oxide material according to an embodiment of the present invention.

FIG. 7A illustrates a structure including one hexacoordinate In atom and six tetracoordinate oxygen (hereinafter referred to as tetracoordinate O) atoms proximate to the In atom. Such a structure in which one metal atom and proximate oxygen atoms to the metal atom are only illustrated is called a subunit here. The structure in FIG. 7A is an octahedral structure, but is illustrated as a planar structure for simplicity. Note that three tetracoordinate O atoms exist in each of an upper half and a lower half in FIG. 7A. In the subunit illustrated in FIG. 7A, the electric charge is 0.

Figure 7D:
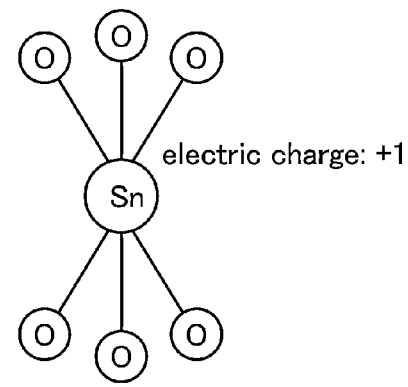
Figure 7B:
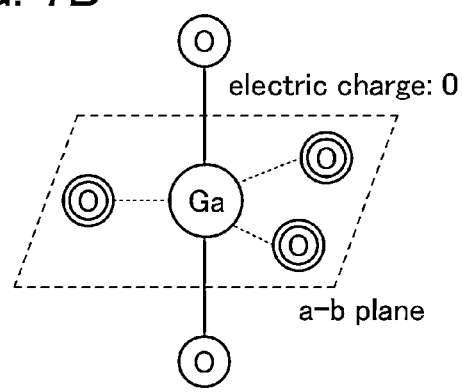

FIG. 7B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 7B. An In atom can also have the structure illustrated in FIG. 7B because an In atom can have five ligands. In the subunit illustrated in FIG. 7B, the electric charge is 0.

Figure 7E:
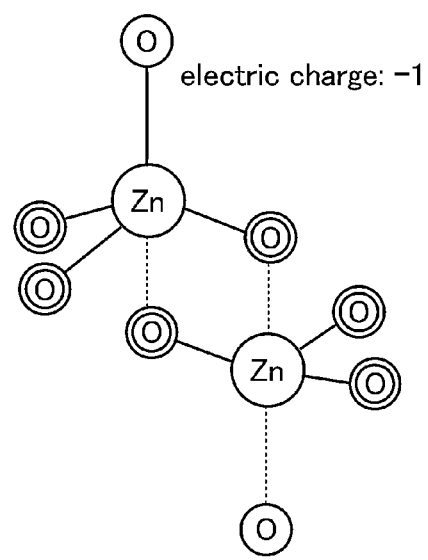
Figure 7C:
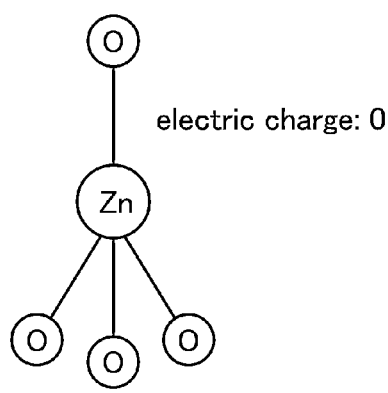

FIG. 7C illustrates a structure including one tetracoordinate Zn atom and four tetracoordinate O atoms proximate to the Zn atom. In FIG. 7C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 7C. In the subunit illustrated in FIG. 7C, the electric charge is 0.

FIG. 7D illustrates a structure including one hexacoordinate Sn atom and six tetracoordinate O atoms proximate to the Sn atom. In FIG. 7D, three tetracoordinate O atoms exist in each of an upper half and a lower half. In the subunit illustrated in FIG. 7D, the electric charge is +1.

FIG. 7E illustrates a subunit including two Zn atoms. In FIG. 7E, one tetracoordinate O atom exists in each of an upper half and a lower half. In the subunit illustrated in FIG. 7E, the electric charge is −1.

Here, a plurality of subunits forms one group, and one cycle including a plurality of groups is called one unit.

Now, a rule of bonding between the subunits will be described. The three O atoms in the upper half with respect to the hexacoordinate In atom in FIG. 7A each have three proximate In atoms in the downward direction, and the three O atoms in the lower half each have three proximate In atoms in the upward direction. The one O atom in the upper half with respect to the pentacoordinate Ga atom in FIG. 7B has one proximate Ga atom in the downward direction, and the one O atom in the lower half has one proximate Ga atom in the upward direction. The one O atom in the upper half with respect to the tetracoordinate Zn atom in FIG. 7C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. Besides, subunits are bonded to each other so that the total electric charge in the layered structure is 0, whereby one group is formed.

Figure 8A:
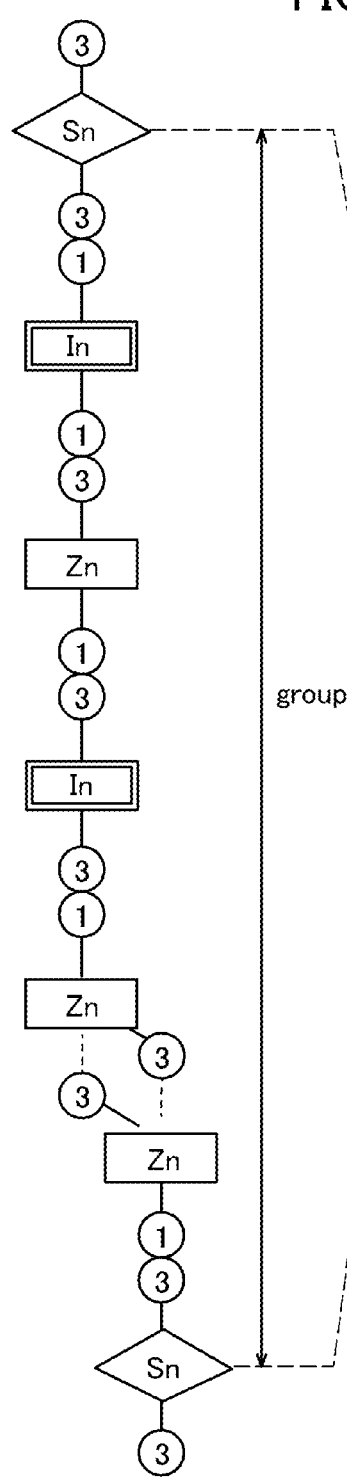
FIGS. 8A to 8C illustrate a structure of an oxide material according to an embodiment of the present invention.
Figure 8B:
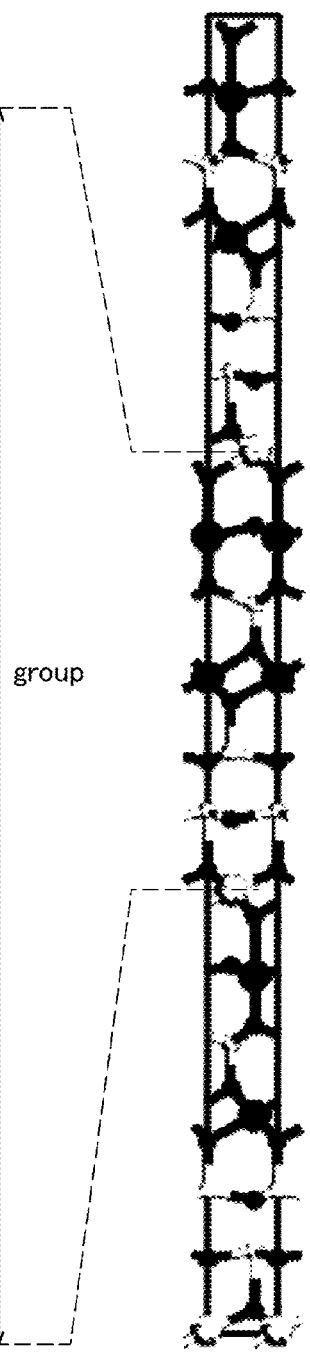
Figure 8C:
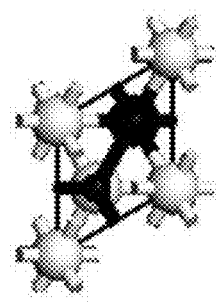

FIG. 8A illustrates a model of one group included in a layered structure of an In—Sn—Zn—O-based material. FIG. 8B illustrates a unit including three groups. Note that FIG. 8C illustrates an atomic arrangement in the case where the layered structure in FIG. 8B is observed from the c-axis direction.

In FIG. 8A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 8A, one tetracoordinate O atom existing in each of an upper half and a lower half with respect to an In atom is denoted by circled 1. FIG. 8A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn—O-based material in FIG. 8A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate 0 atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A unit is formed by bonding a plurality of groups, which corresponds to one cycle.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Thus, electric charge of a subunit including a Sn atom is +1. Therefore, electric charge of −1, which cancels +1, is needed to form a layered structure including a Sn atom. As a structure having electric charge of −1, the subunit including two Zn atoms as illustrated in FIG. 7E can be given. For example, with one subunit including two Zn atoms, electric charge of one subunit including a Sn atom can be canceled, so that the total electric charge in the layered structure can be 0.

An In atom can have either five ligands or six ligands. Specifically, when a unit illustrated in FIG. 8B is formed, In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following materials: a four-component metal oxide such as an In—Sn—Ga—Zn-based oxide; a three-component metal oxide such as an In—Ga—Zn-based oxide, an In—Al—Zn-based oxide, a Sn—Ga—Zn-based oxide, an Al—Ga—Zn-based oxide, or a Sn—Al—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 9A illustrates a model of one group included in a layered structure of an In—Ga—Zn—O-based material.

In the group included in the layered structure of the In—Ga—Zn—O-based material in FIG. 9A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A unit is formed by bonding a plurality of groups, which corresponds to one cycle.

FIG. 9B illustrates a unit including three groups. Note that FIG. 9C illustrates an atomic arrangement in the case where the layered structure in FIG. 9B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a subunit including any of an In atom, a Zn atom, or a Ga atom is 0.

As a result, the total electric charge of a group having a combination of such subunits is always 0.

In order to form the layered structure of the In—Ga—Zn—O-based material, a unit can be formed using not only the group illustrated in FIG. 9A but also a combination of groups having different arrangement of the In atom, the Ga atom, and the Zn atom.

The interlayer insulating film 18 may be formed with a single layer or a stacked layer using one or more of silicon oxide, silicon oxynitride, silicon nitride oxide, silicon nitride, aluminum oxide, aluminum oxynitride, and aluminum nitride by a sputtering method, a CVD method, or the like. For example, the interlayer insulating film 18 may be formed by a plasma CVD method with use of a mixture which includes a silane gas as a main material and a proper source gas selected from a nitrogen oxide gas, a nitrogen gas, a hydrogen gas, and a rare gas. In addition, the substrate temperature is preferably higher than or equal to 200° C. and lower than or equal to 550° C.

In this embodiment, the gate electrode 14 does not overlap with the pair of low-resistance regions 12 or the pair of electrodes 16 and an offset region is formed. However, the present invention is not limited to the above structure. For example, a structure in which the gate electrode 14 overlaps with the pair of low-resistance regions 12 or the pair of electrodes 16 may be employed.

According to the structure described above, in the first transistor 101 and the second transistor 102, the semiconductor substrate 11 part of which functions as a channel region of the first transistor 101 and the semiconductor film 17 functioning as a channel region of the second transistor 102 surround the gate electrode 14. Accordingly, the effective channel length can be longer than an apparent channel length that is a distance between the pair of low-resistance regions 12 or between the pair of electrodes 16 viewed from above. Further, the first transistor 101 and the second transistor 102 can be stacked, so that an area of a semiconductor device can be reduced. Therefore, the influence of the short-channel effect can be reduced even when the size of the transistor is reduced, and thus the integration degree of the semiconductor device can be increased. Further, the semiconductor device whose manufacturing cost is low can be provided with high yield.

Furthermore, in the structures of transistors illustrated in FIG. 2, the length L1 and the length L2 are adjusted, whereby the effective channel length of the first transistor 101 and the effective channel length of the second transistor 102 can be controlled, respectively. For example, in the case where the on-state current of the second transistor 102 is increased, the length L2 is made small, so that the on-state current of the second transistor 102 can be increased.

As described above, by adjusting the lengths of L1 and L2, the on-state current of the first transistor 101 and the on-state current of the second transistor 102 can be controlled. In ideal operation of an inverter circuit, the rise time and the fall time of a square wave of a signal input/output to/from the inverter are equal. In a CMOS inverter, in the case where there is a large difference between the on-state current of a p-channel transistor and the on-state current of an n-channel transistor, even if the square wave of the input signal has an ideal form, the waveform is distorted when the signal is output. For example, in the case where the on-state current of the p-channel transistor is only half the on-state current of the n-channel transistor, the rise time at an output node is twice as long as the fall time. In order to prevent distortion of the waveform, it is preferable that the amount of on-state current of the p-channel transistor and the amount of on-state current of the n-channel transistor be equal. Therefore, the lengths of L1 and L2 are adjusted to control the on-state current of the first transistor 101 and the on-state current of the second transistor 102, whereby the on-state current of the p-channel transistor and the on-state current of the n-channel transistor can be equal.

Figure 3A:
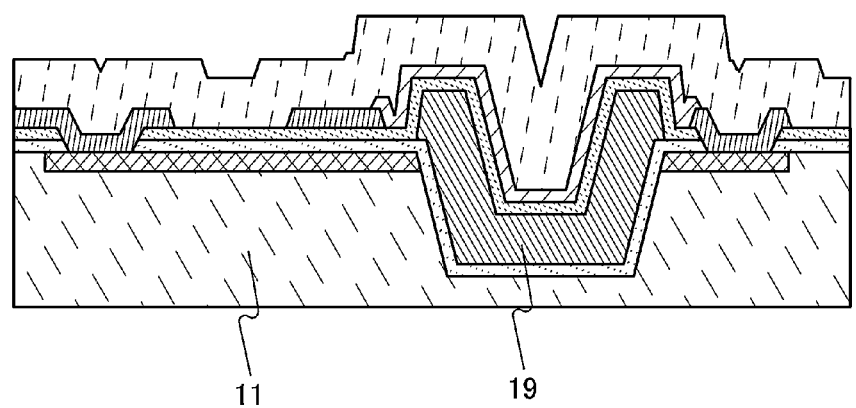
FIGS. 3A and 3B are each a cross-sectional view illustrating an example of a semiconductor device according to an embodiment of the present invention.
Figure 3B:
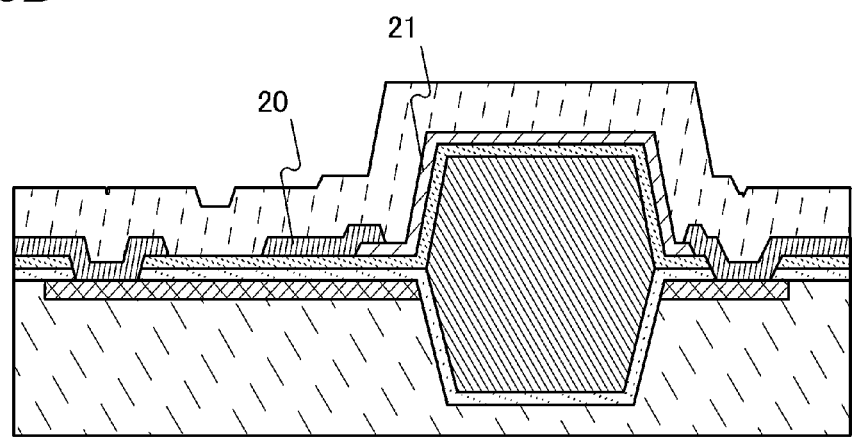

An inverter including transistors illustrated in FIG. 3A or 3B can obtain the effect similar to that of the inverter including the transistors illustrated in FIG. 2. A difference between the structure of the transistors in FIG. 3A and the structure of the transistors in FIG. 2 is a shape of the gate electrode in the second transistor 102. Whereas the gate electrode 14 illustrated in FIG. 2 is formed to completely fill the groove portion provided in the semiconductor substrate 11, a gate electrode 19 illustrated in FIG. 3A does not completely fill the groove portion provided in the semiconductor substrate 11. Thus, when the gate electrode is not formed to fill the groove portion completely but formed along a shape of the groove portion, the effect of the present invention can be obtained as well. A difference between the structure of the transistors in FIG. 3B and the structure of the transistors in FIG. 2 is the stacked order of the pair of electrodes and the semiconductor film. That is, in the structure of transistors illustrated in FIG. 3B, a pair of electrodes 20 is formed over a semiconductor film 21.

With the use of any of the transistors illustrated in FIG. 2 and FIGS. 3A and 3B, an SRAM circuit shown in FIG. 1B can be formed.

<Example of Method for Manufacturing Transistors>

Next, an example of a method for manufacturing the first transistor 101 and the second transistor 102 illustrated in FIG. 2 will be described with reference to FIGS. 4A to 4D.

Figure 4A:
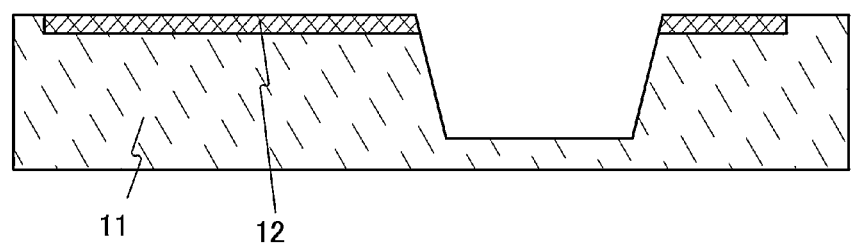
FIGS. 4A to 4D are cross-sectional views illustrating an example of a manufacturing process of a semiconductor device, according to an embodiment of the present invention.

As illustrated in FIG. 4A, an impurity is added to a surface of the semiconductor substrate 11, whereby the pair of low-resistance regions 12 is formed, and the semiconductor substrate 11 is processed, so that the groove portion is provided. Although the groove portion illustrated in FIG. 4A has a shape formed using planar surfaces, the shape of the groove portion is not limited to this shape. A shape formed using a curved surface or the like may be employed.

Figure 4B:
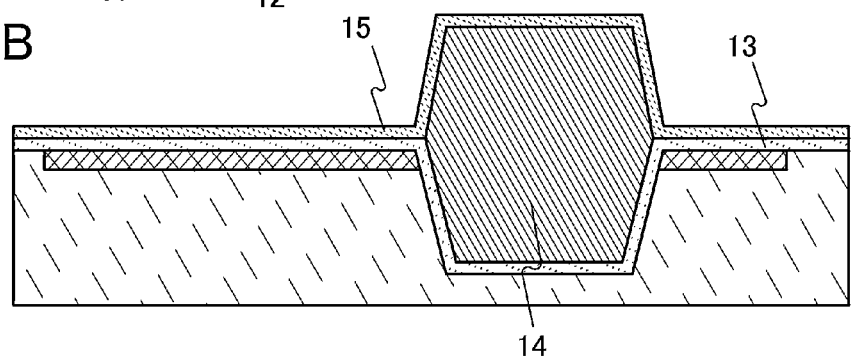

Then, as illustrated in FIG. 4B, the first gate insulating film 13 is formed on the surface of the semiconductor substrate 11 by a thermal oxidation method. Instead of a thermal oxidation method, a deposition method such as a sputtering method or a CVD method may be used for forming an insulating film. Alternatively, an insulating film may be formed by a combination of a thermal oxidation method and a deposition method.

Next, the gate electrode 14 is formed over the first gate insulating film 13 in such a manner that a conductive film is formed, a mask is formed over the conductive film, and the conductive film is selectively etched with the use of the mask. The mask used in the etching can be formed as appropriate by a photolithography process, an inkjet method, a printing method, or the like.

The pair of low-resistance regions 12 illustrated in FIG. 4A can be formed also in such a self-aligned manner that an impurity is added to the semiconductor substrate 11 after the gate electrode 14 is formed.

Next, the second gate insulating film 15 is formed over the gate electrode 14 and the first gate insulating film 13.

Figure 4C:
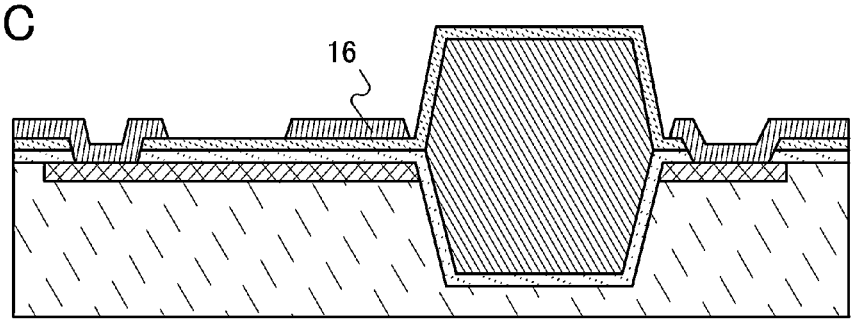

Next, as illustrated in FIG. 4C, the first gate insulating film 13 and the second gate insulating film 15 are processed to form a contact hole, and the pair of electrodes 16 is formed so that one of the pair of electrodes 16 is connected to one of the pair of low-resistance regions 12 through the contact hole. The pair of electrodes 16 is formed in such a manner that a conductive film is formed, a mask is formed over the conductive film, and the conductive film is selectively etched with the use of the mask.

Figure 4D:
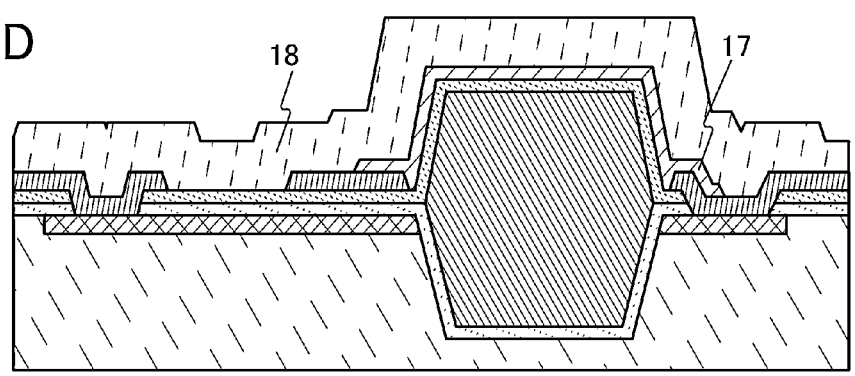

Next, as illustrated in FIG. 4D, the semiconductor film 17 is formed to be in contact with the pair of electrodes 16 and overlap with the gate electrode 14 with the second gate insulating film 15 interposed therebetween. The semiconductor film 17 is formed in such a manner, for example, that an oxide semiconductor film with a thickness of greater than or equal to 1 nm and less than or equal to 50 nm is formed by a sputtering method, a mask is formed over the oxide semiconductor film, and the oxide semiconductor film is selectively etched with the use of the mask.

Wet etching or dry etching can be employed as appropriate for the etching of the oxide semiconductor film.

After the oxide semiconductor film is formed, the semiconductor substrate 11 is preferably subjected to heat treatment to release moisture and hydrogen from the oxide semiconductor film. Through the heat treatment, an oxide semiconductor film including CAAC-OS with higher crystallinity can be formed.

The temperature for the heat treatment is preferably set such that moisture and hydrogen can be released from the oxide semiconductor film; the temperature is typically higher than or equal to 200° C. and lower than the strain point of the semiconductor substrate 11, preferably higher than or equal to 250° C. and lower than or equal to 450° C.

A rapid thermal annealing (RTA) apparatus can be used for the heat treatment. With the use of the RTA apparatus, heat treatment can be performed at a temperature that is higher than or equal to the strain point of the substrate if the heating time is short. Thus, the time required for formation of the oxide semiconductor film including CAAC-OS can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere, a reduced-pressure atmosphere, or in vacuum. The treatment time is from 3 minutes to 24 hours. Heat treatment for longer than 24 hours is not preferable because the productivity is reduced.

In addition, after moisture and hydrogen are released from the oxide semiconductor film by the above heat treatment, the oxide semiconductor film may be heated in an oxygen atmosphere, so that oxygen is supplied to the oxide semiconductor film, and accordingly oxygen vacancies serving as a donor in the oxide semiconductor film may be reduced. The temperature of the heat treatment is higher than or equal to 200° C. and lower than the strain point of the semiconductor substrate 11, preferably higher than or equal to 250° C. and lower than or equal to 450° C. It is preferable that an oxygen gas used for the heat treatment in an oxygen atmosphere do not include water, hydrogen, or the like. Alternatively, the purity of the oxygen gas which is introduced into the heat treatment apparatus is preferably greater than or equal to 6N (99.9999%), further preferably greater than or equal to 7N (99.99999%) (that is, the impurity concentration in the oxygen is lower than or equal to 1 ppm, preferably lower than or equal to 0.1 ppm).

Alternatively, oxygen may be added to the oxide semiconductor film by an ion implantation method or an ion doping method, so that oxygen vacancies serving as a donor is reduced. Further alternatively, oxygen which is made to be plasma may be added to the oxide semiconductor film with a microwave with a frequency of 2.45 GHz.

Then, the interlayer insulating film 18 is formed over the semiconductor film 17. Although not illustrated here, a contact hole may be formed in the interlayer insulating film 18, and a wiring connected to the pair of low-resistance regions 12 or the pair of electrodes 16 through the contact hole may be formed.

Through the above steps, transistors which achieve miniaturization and suppression of a short-channel effect and consume less power can be manufactured.

This embodiment can be combined with any of the other embodiments as appropriate.

The SRAM circuit illustrated in FIGS. 1A and 1B can be formed using the transistors and the inverters formed in the above described manner.

<Operation of SRAM Circuit>

Next, operation of the SRAM circuit illustrated in FIG. 1B will be described below.

For reading operation, first, the word line (WL) is set high (H), so that the first selection transistor 200 and the second selection transistor 400 are turned on. Thus, data held in the first inverter 100 and the second inverter 300 is output to the first signal line (S1) and the second signal line (S2) through the first selection transistor 200 and the second selection transistor 400. Although not illustrated, a sense amplifier may be connected to each of the first signal line (S1) and the second signal line (S2).

For writing operation, the word line (WL) is set high (H), so that the first selection transistor 200 and the second selection transistor 400 are turned on. Then, data is output from the first signal line (S1) and the second signal line (S2) to be written to the first inverter 100 and the second inverter 300.

In the SRAM circuit, data written is held in the inverters, and the data can be held as long as power is supplied from the VDD.

The SRAM circuit reads, writes, and holds data in the above described manners.

Embodiment 2

In this embodiment, an example of a CPU including the semiconductor device described in Embodiment 1 will be described.

Figure 5A:
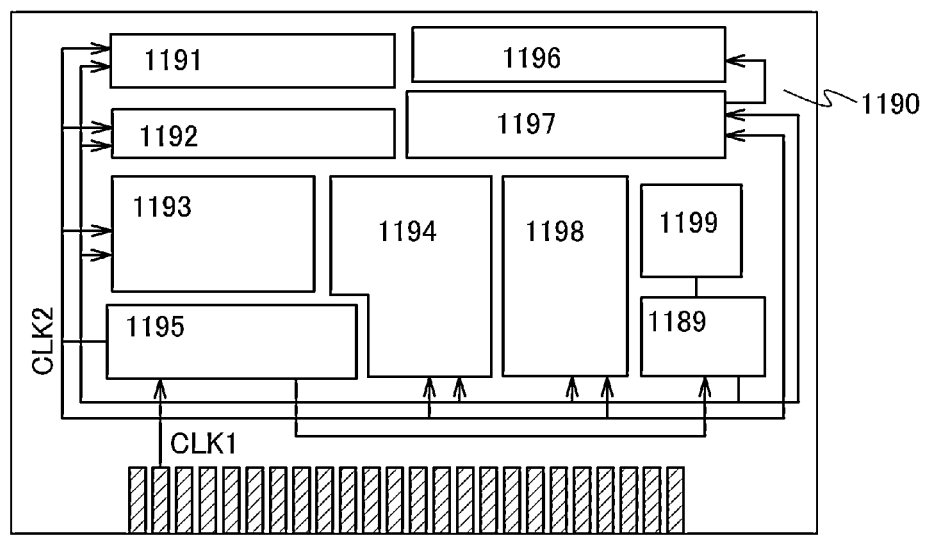
FIG. 5A is a block diagram illustrating a specific example of a CPU including a semiconductor device according to an embodiment of the present invention and FIGS. 5B and 5C are each a circuit diagram of part thereof.

FIG. 5A is a block diagram illustrating a specific structure of a CPU. The CPU illustrated in FIG. 5A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a ROM 1199 which is rewritable, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 5A is just an example in which the configuration is simplified, and an actual CPU may have various configurations depending on the application.

An instruction that is input to the CPU via the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 5A, a memory element is provided in the register 1196. The memory element including the semiconductor device described in Embodiment 1 can be used as the memory element provided in the register 1196.

In the CPU illustrated in FIG. 5A, the register controller 1197 selects operation of holding data in the register 1196 in accordance with an instruction from the ALU 1191. That is, the register controller 1197 selects whether data is held by a flip-flop or by a capacitor in the memory element included in the register 1196. When data holding by the flip-flop is selected, power supply voltage is supplied to the memory element in the register 1196. When data holding by the capacitor is selected, the data is rewritten in the capacitor, and supply of power supply voltage to the memory element in the register 1196 can be stopped.

Figure 5B:
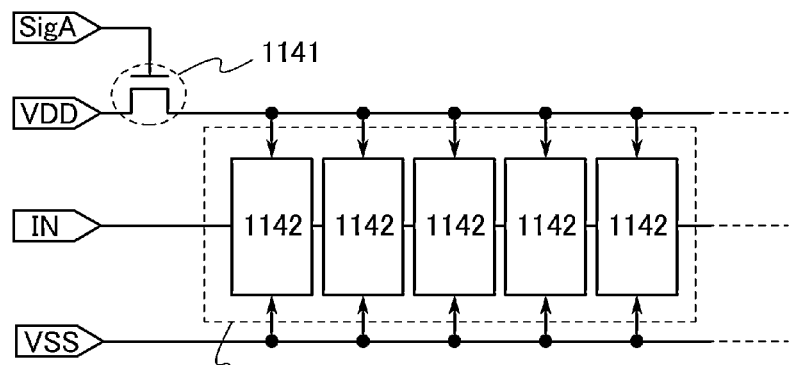
Figure 5C:
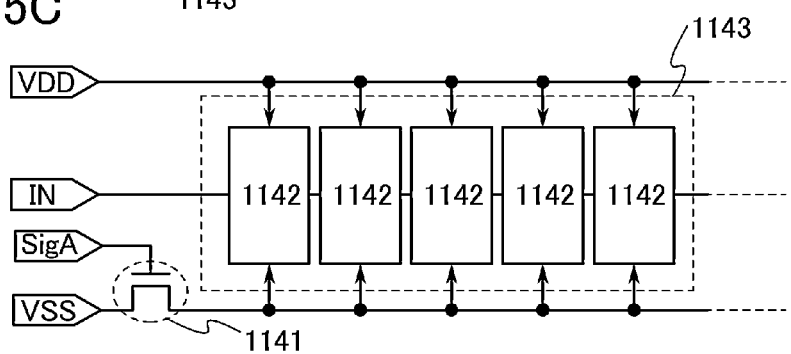

A switching element is provided between a memory element group and a node to which a power supply potential VDD or a power supply potential VSS is supplied, as illustrated in FIG. 5B or FIG. 5C, so that the power supply can be stopped. Circuits illustrated in FIGS. 5B and 5C are described below.

FIGS. 5B and 5C each illustrate an example of a structure of a memory device including a transistor including an oxide semiconductor as a switching element for controlling supply of a power supply potential to a memory element.

The memory device illustrated in FIG. 5B includes a switching element 1141 and a memory element group 1143 including a plurality of memory elements 1142. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 5B, a transistor including a semiconductor with a wide band gap, such as an oxide semiconductor, is used as the switching element 1141, and the switching of the transistor is controlled by a signal Sig A supplied to a gate thereof.

Note that FIG. 5B illustrates the structure in which the switching element 1141 includes only one transistor; however, without limitation thereon, the switching element 1141 may include a plurality of transistors. In the case where the switching element 1141 includes a plurality of transistors each serving as a switching element, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 5B, the switching element 1141 may control the supply of the low-level power supply potential VSS.

In FIG. 5C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the semiconductor device can also be applied to an LSI such as a digital signal processor (DSP), a custom LSI, or a field programmable gate array (FPGA).

This embodiment can be combined with any of the other embodiments as appropriate.

Embodiment 3

In this embodiment, examples of electronic devices to which Embodiments 1 and 2 are applied will be described.

Figure 6A:
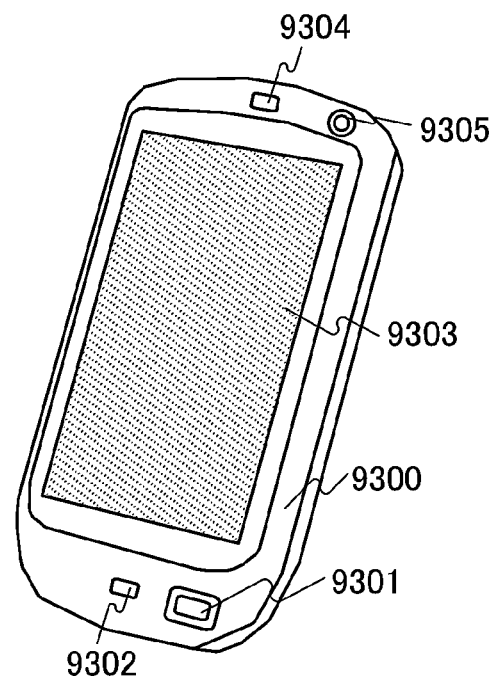
FIGS. 6A and 6B are each a perspective view illustrating an example of an electronic device according to an embodiment of the present invention.

FIG. 6A illustrates a portable information terminal. The portable information terminal includes a housing 9300, a button 9301, a microphone 9302, a display portion 9303, a speaker 9304, and a camera 9305, and has a function as a mobile phone. Although not particularly illustrated, an embodiment of the present invention can also be applied to a logic circuit used for an arithmetic device, a wireless circuit, or a memory circuit in a main body.

Figure 6B:
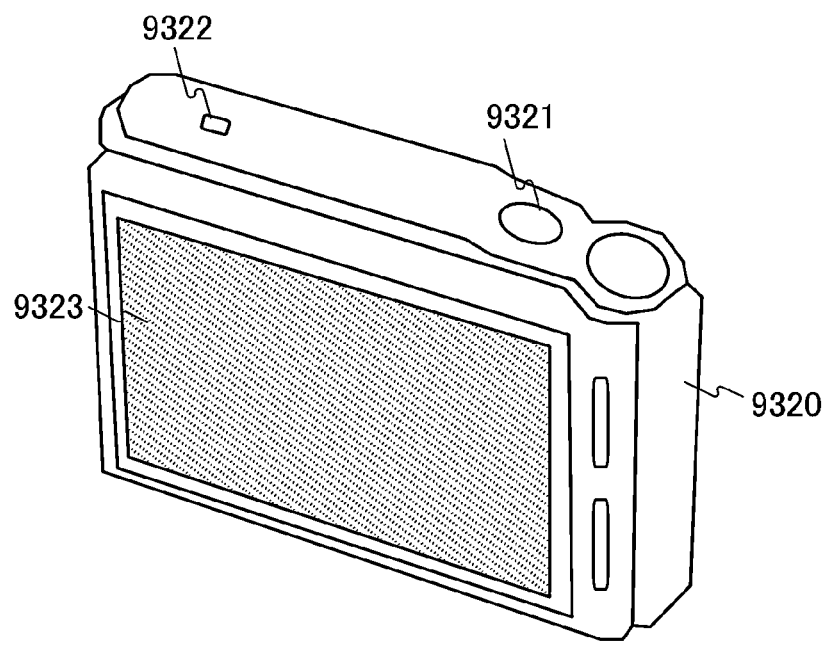

FIG. 6B illustrates a digital still camera. The digital still camera includes a housing 9320, a button 9321, a microphone 9322, and a display portion 9323. Although not particularly illustrated, an embodiment of the present invention can also be applied to a logic circuit used for a memory circuit or an image sensor in a main body.

By applying an embodiment of the present invention, the performance of an electronic device can be improved.

This embodiment can be combined with any of the other embodiments as appropriate.

This application is based on Japanese Patent Application serial no. 2011-151528 filed with Japan Patent Office on Jul. 8, 2011, the entire contents of which are hereby incorporated by reference.

What is claimed is:

1. A semiconductor device comprising:
   a semiconductor substrate;
   a first inverter; and
   a second inverter,
   wherein an output terminal of the first inverter is electrically connected to an input terminal of the second inverter,
   wherein an output terminal of the second inverter is electrically connected to an input terminal of the first inverter,
   wherein each of the first inverter and the second inverter comprises a first transistor and a second transistor, wherein the first transistor comprises:
  the semiconductor substrate having a source region and a drain region, wherein the semiconductor substrate has a groove portion arranged between the source region and the drain region;
  a first gate insulating film formed on a side surface and a bottom surface of the groove portion; and
  a gate electrode formed in the groove portion with the first gate insulating film provided between the semiconductor substrate and the gate electrode, wherein the first transistor and the second transistor share the gate electrode, and
wherein the second transistor comprises:
  a second gate insulating film covering the gate electrode;
  a semiconductor film overlapping with the gate electrode with the second gate insulating film provided therebetween; and
  a pair of electrodes in contact with the semiconductor film,
wherein the pair of electrodes is formed between the second gate insulating film and the semiconductor film.

2. The semiconductor device according to claim 1, further comprising:
  a first selection transistor; and
  a second selection transistor,
  wherein one of a source and a drain of the first selection transistor is electrically connected to the output terminal of the first inverter and the input terminal of the second inverter,
  wherein one of a source and a drain of the second selection transistor is electrically connected to the output terminal of the second inverter and the input terminal of the first inverter,
  wherein gates of the first selection transistor and the second selection transistor are electrically connected to a first line,
  wherein the other of the source and the drain of the first selection transistor is electrically connected to a second line, and
  wherein the other of the source and the drain of the second selection transistor is electrically connected to a third line.

3. The semiconductor device according to claim 1,
  wherein the semiconductor substrate is an n-type semiconductor, and
  wherein the source region and the drain region are each a p-type semiconductor.

4. The semiconductor device according to claim 1, wherein the semiconductor film comprises an oxide semiconductor comprising one or more of elements selected from In, Ga, Sn, and Zn.

5. The semiconductor device according to claim 1,
  wherein the first gate insulating film of the first inverter and the first gate insulating film of the second inverter are formed from a same film, and
  wherein the second gate insulating film of the first inverter and the second gate insulating film of the second inverter are formed from a same film.

6. A semiconductor device comprising:
  a semiconductor substrate comprising a pair of first low-resistance regions and a pair of second low-resistance regions, wherein a resistance of each of the pair of first low-resistance regions and the pair of second low-resistance regions is lower than a resistance of the semiconductor substrate;
  a first insulating film overlapping with the semiconductor substrate;
  a first conductive film overlapping with the semiconductor substrate with the first insulating film provided therebetween;
  a second insulating film over the first conductive film;
  a first semiconductor film overlapping with the first conductive film with the second insulating film provided therebetween;
  a pair of first electrodes in contact with the first semiconductor film;
  a third insulating film overlapping with the semiconductor substrate;
  a second conductive film overlapping with the semiconductor substrate with the third insulating film provided therebetween;
  a fourth insulating film over the second conductive film;
  a second semiconductor film overlapping with the second conductive film with the fourth insulating film provided therebetween; and
  a pair of second electrodes in contact with the second semiconductor film,
  wherein the first conductive film, one of the pair of second low-resistance regions, and one of the pair of second electrodes are electrically connected to one another,
  wherein the second conductive film, one of the pair of first low-resistance regions, and one of the pair of first electrodes are electrically connected to one another,
  wherein the semiconductor substrate has a first groove portion between the pair of first low-resistance regions and a second groove portion between the pair of second low-resistance regions,
  wherein the first insulating film is formed on a side surface and a bottom surface of the first groove portion,
  wherein the first conductive film is formed in the first groove portion,
  wherein the second insulating film is formed on a side surface and a bottom surface of the second groove portion, and
  wherein the second conductive film is formed in the second groove portion.

7. The semiconductor device according to claim 6, further comprising:
  a first selection transistor; and
  a second selection transistor,
  wherein one of a source and a drain of the first selection transistor is electrically connected to the second conductive film, one of the pair of first low-resistance regions, and one of the pair of first electrodes,
  wherein one of a source and a drain of the second selection transistor is electrically connected to the first conductive film, one of the pair of second low-resistance regions, and one of the pair of second electrodes,
  wherein gates of the first selection transistor and the second selection transistor are electrically connected to a first line,
  wherein the other of the source and the drain of the first selection transistor is electrically connected to a second line, and
  wherein the other of the source and the drain of the second selection transistor is electrically connected to a third line.

8. The semiconductor device according to claim 6,
  wherein the pair of first electrodes is formed between the second insulating film and the first semiconductor film, and wherein the pair of second electrodes is formed between the fourth insulating film and the second semiconductor film.

9. The semiconductor device according to claim 6, wherein the first semiconductor film is formed between the second insulating film and the pair of first electrodes, and
wherein the second semiconductor film is formed between the fourth insulating film and the pair of second electrodes.

10. The semiconductor device according to claim 6, wherein the semiconductor substrate is an n-type semiconductor, and
wherein the pair of first low-resistance regions and the pair of second low-resistance regions are each a p-type semiconductor.

11. The semiconductor device according to claim 6, wherein the first semiconductor film and the second semiconductor film each comprise an oxide semiconductor comprising one or more of elements selected from In, Ga, Sn, and Zn.

12. The semiconductor device according to claim 6, wherein the first insulating film and the third insulating film are formed from a same film, and
wherein the second insulating film and the fourth insulating film are formed from a same film.

13. A semiconductor device comprising:
a semiconductor substrate;
a first inverter; and
a second inverter,
wherein an output terminal of the first inverter is electrically connected to an input terminal of the second inverter,
wherein an output terminal of the second inverter is electrically connected to an input terminal of the first inverter,
wherein each of the first inverter and the second inverter comprises a first transistor and a second transistor,
wherein the first transistor comprises:
the semiconductor substrate having a source region and a drain region wherein the semiconductor substrate has a groove portion arranged between the source region and the drain region;
a first gate insulating film formed on a side surface and a bottom surface of the groove portion; and
a gate electrode formed in the groove portion with the first gate insulating film provided between the semiconductor substrate and the gate electrode, wherein the first transistor and the second transistor share the gate electrode, and wherein the second transistor comprises:
a second gate insulating film covering the gate electrode and being in contact with the first gate insulating film;
a semiconductor film overlapping with the gate electrode with the second gate insulating film provided therebetween; and
a pair of electrodes in contact with the semiconductor film,
wherein the semiconductor film comprises an oxide semiconductor comprising one or more of elements selected from In, Ga, Sn, and Zn.

14. The semiconductor device according to claim 13, further comprising:
a first selection transistor; and
a second selection transistor,
wherein one of a source and a drain of the first selection transistor is electrically connected to the output terminal of the first inverter and the input terminal of the second inverter,
wherein one of a source and a drain of the second selection transistor is electrically connected to the output terminal of the second inverter and the input terminal of the first inverter,
wherein gates of the first selection transistor and the second selection transistor are electrically connected to a first line,
wherein the other of the source and the drain of the first selection transistor is electrically connected to a second line, and
wherein the other of the source and the drain of the second selection transistor is electrically connected to a third line.

15. The semiconductor device according to claim 13, wherein the pair of electrodes is formed between the second gate insulating film and the semiconductor film.

16. The semiconductor device according to claim 13, wherein the semiconductor film is formed between the second gate insulating film and the pair of electrodes.

17. The semiconductor device according to claim 13, wherein the semiconductor substrate is an n-type semiconductor, and
wherein the source region and the drain region are each a p-type semiconductor.

18. The semiconductor device according to claim 13, wherein the first gate insulating film of the first inverter and the first gate insulating film of the second inverter are formed from a same film, and
wherein the second gate insulating film of the first inverter and the second gate insulating film of the second inverter are formed from a same film.

* * * * *